United States Patent
Yeh

(10) Patent No.: US 11,682,470 B2
(45) Date of Patent: Jun. 20, 2023

(54) MEMORY DEVICE AND OPERATING METHOD THEREOF

(71) Applicant: Winbond Electronics Corp., Taichung (TW)

(72) Inventor: Jun-Lin Yeh, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/517,624

(22) Filed: Nov. 2, 2021

(65) Prior Publication Data

US 2022/0139493 A1    May 5, 2022

(30) Foreign Application Priority Data

Nov. 3, 2020 (TW) .................................. 109138165

(51) Int. Cl.
  *G11C 29/00* (2006.01)
  *G11C 29/44* (2006.01)
  *G11C 16/34* (2006.01)
  *G11C 7/10* (2006.01)
  *G11C 15/04* (2006.01)

(52) U.S. Cl.
  CPC .......... *G11C 29/787* (2013.01); *G11C 7/1039* (2013.01); *G11C 15/04* (2013.01); *G11C 16/3445* (2013.01); *G11C 16/3459* (2013.01); *G11C 29/4401* (2013.01); *G11C 29/76* (2013.01)

(58) Field of Classification Search
  CPC ..... G11C 29/787; G11C 7/1039; G11C 15/04; G11C 16/3445; G11C 16/3459; G11C 29/4401; G11C 29/76; G11C 29/785; G11C 29/789; G11C 17/16

USPC ......................................................... 714/710
See application file for complete search history.

(56) References Cited

U.S. PATENT DOCUMENTS

| | | | |
|---|---|---|---|
| 4,714,839 A | 12/1987 | Chung | |
| 6,536,002 B1* | 3/2003 | Kim | G11C 29/787 |
| | | | 714/710 |
| 6,560,728 B2* | 5/2003 | Merritt | G11C 7/1006 |
| | | | 714/710 |
| 9,627,094 B2* | 4/2017 | Yano | G11C 16/3404 |

(Continued)

FOREIGN PATENT DOCUMENTS

TW    I579862    4/2017

*Primary Examiner* — Albert Decady
*Assistant Examiner* — Enam Ahmed
(74) *Attorney, Agent, or Firm* — JCIPRNET

(57) ABSTRACT

A memory device including a memory cell array, a redundant fuse circuit and a memory controller is provided. The memory cell array includes multiple regular memory blocks and multiple redundant memory blocks. The redundant fuse circuit includes multiple fuse groups recording multiple repair information. Each repair information is associated with a corresponding one of the redundant memory blocks and includes a repair address, a first enable bit, and a second enable bit. The memory controller includes multiple determining circuits. Each of the multiple determining circuits generates a hit signal according to an operation address, the repair address, the first enable bit, and the second enable bit. When a target memory block is bad, and the determining circuit of the memory controller generates the hit signal, the memory controller disables the redundant memory block that is bad according to the hit signal.

20 Claims, 8 Drawing Sheets

(56) References Cited

U.S. PATENT DOCUMENTS

| | | | |
|---|---|---|---|
| 10,249,376 B2 | 4/2019 | Yeh | |
| 2002/0181303 A1* | 12/2002 | Kato | G11C 29/808 |
| | | | 365/200 |
| 2006/0085700 A1* | 4/2006 | Fong | G11C 15/00 |
| | | | 714/710 |
| 2006/0227621 A1* | 10/2006 | Kasai | G11C 29/838 |
| | | | 365/185.29 |
| 2006/0242492 A1* | 10/2006 | Hoffmann | G11C 29/24 |
| | | | 714/718 |
| 2012/0075902 A1* | 3/2012 | MacWilliams | G06F 12/0646 |
| | | | 365/230.01 |
| 2014/0254286 A1* | 9/2014 | Bronner | G11C 13/0002 |
| | | | 365/185.29 |
| 2018/0090227 A1* | 3/2018 | Lee | G11C 7/10 |
| 2019/0235762 A1* | 8/2019 | Kaburaki | G06F 12/0864 |

* cited by examiner

MEMORY DEVICE AND OPERATING METHOD THEREOF

CROSS-REFERENCE TO RELATED APPLICATION

This application claims the priority benefit of Taiwan application serial no. 109138165, filed on Nov. 3, 2020. The entirety of the above-mentioned patent application is hereby incorporated by reference herein and made a part of this specification.

BACKGROUND

Technical Field

The disclosure relates to an electronic apparatus and an operating method thereof, and in particular to a memory device and an operating method thereof.

Description of Related Art

A memory cell is likely to deteriorate after being experienced with many cycling operations including erase operations and program operations, thereby lowering reliability of a memory block, or increasing erase time and program time, i.e. decreasing operating speed. In addition, after many cycling operations, some bits in the memory cell may not meet the specifications due to premature wear. For example, in a flash memory, the cycling operation is likely to generate an interface state at a drain junction of the flash memory and an oxide trap in a tunnel oxide layer of the flash memory. However, these worn-out bits are difficult to remove during a test stage. Accordingly, in an existing technology, error correction codes are used to correct these damaged bits. However, this method may cause problems such as increased wafer size, decreased operating speed, and increased power consumption.

SUMMARY

The disclosure provides a memory device and an operating method thereof, in which reliability and operating speed are improved.

The memory device of the disclosure includes a memory cell array, a redundant fuse circuit, and a memory controller. The memory cell array includes multiple regular memory blocks and multiple redundant memory blocks. The multiple regular memory blocks are configured to store data. The redundant fuse circuit includes multiple fuse groups configured to record multiple repair information. Each of the repair information is associated with one of the multiple redundant memory blocks. Each of the repair information includes a repair address, a first enable bit and a second enable bit. The repair address is configured to indicate a position of the regular memory block that is to be replaced by the associated redundant memory block. The first enable bit is configured to record a usage state of the corresponding fuse group. The second enable bit is configured to enable the corresponding redundant memory block. The memory controller is coupled with the memory cell array and the redundant fuse circuit. The memory controller is configured to perform an operation on a target memory block according to an operation address and determine whether the target memory block is bad. The memory controller includes multiple determining circuits, and each of the multiple determining circuits generates a hit signal according to the operation address, the repair address, the first enable bit and the second enable bit. When the target memory block is bad, and the determining circuit generates the hit signal, the memory controller disables the redundant memory block that is bad according to the hit signal.

The operating method of a memory device of the disclosure is adapted for a memory device including multiple regular memory blocks and multiple redundant memory blocks. The operating method includes the following steps. Multiple repair information as described above are recorded. An operation is performed on a target memory block according to an operation address and whether the target memory block is bad is determined. A hit signal is generated according to the operation address, a repair address, a first enable bit and a second enable bit when the target memory block is bad. The redundant memory block that is bad is disabled according to the hit signal.

Based on the above, the memory controller of the disclosure generates the hit signal according to the operation address, the repair address, the first enable bit, and the second enable bit after determining that the target memory block is bad, and disables the bad redundant memory block according to the hit signal. In this way, the operating speed and reliability of the memory blocks are improved.

In order to make the aforementioned features and advantages of the disclosure comprehensible, embodiments accompanied with drawings are described in detail below.

DESCRIPTION OF THE EMBODIMENTS

Figure 1:
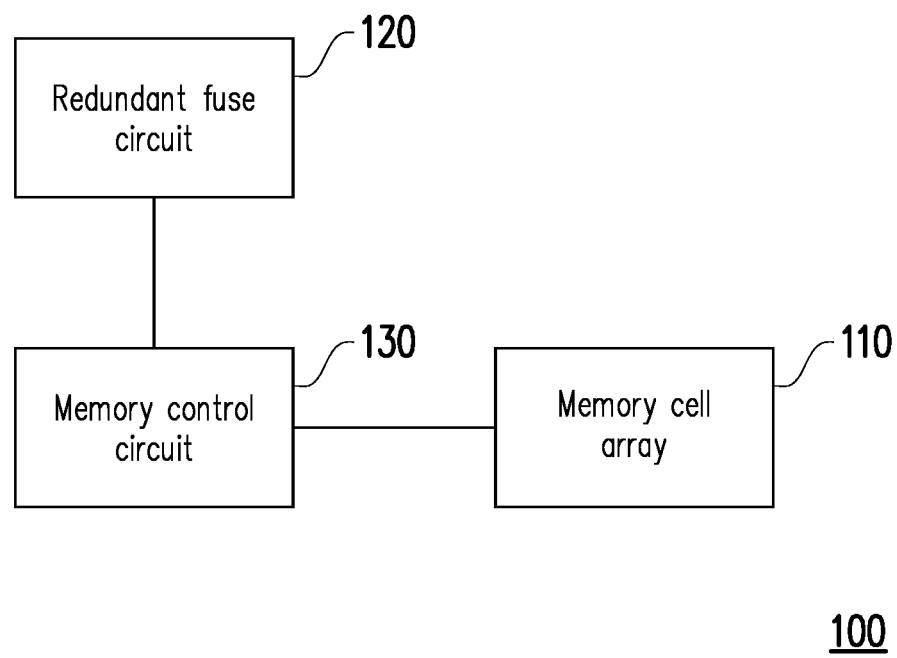
FIG. 1 is a schematic diagram of a memory device according to an embodiment of the disclosure.
Figure 2:
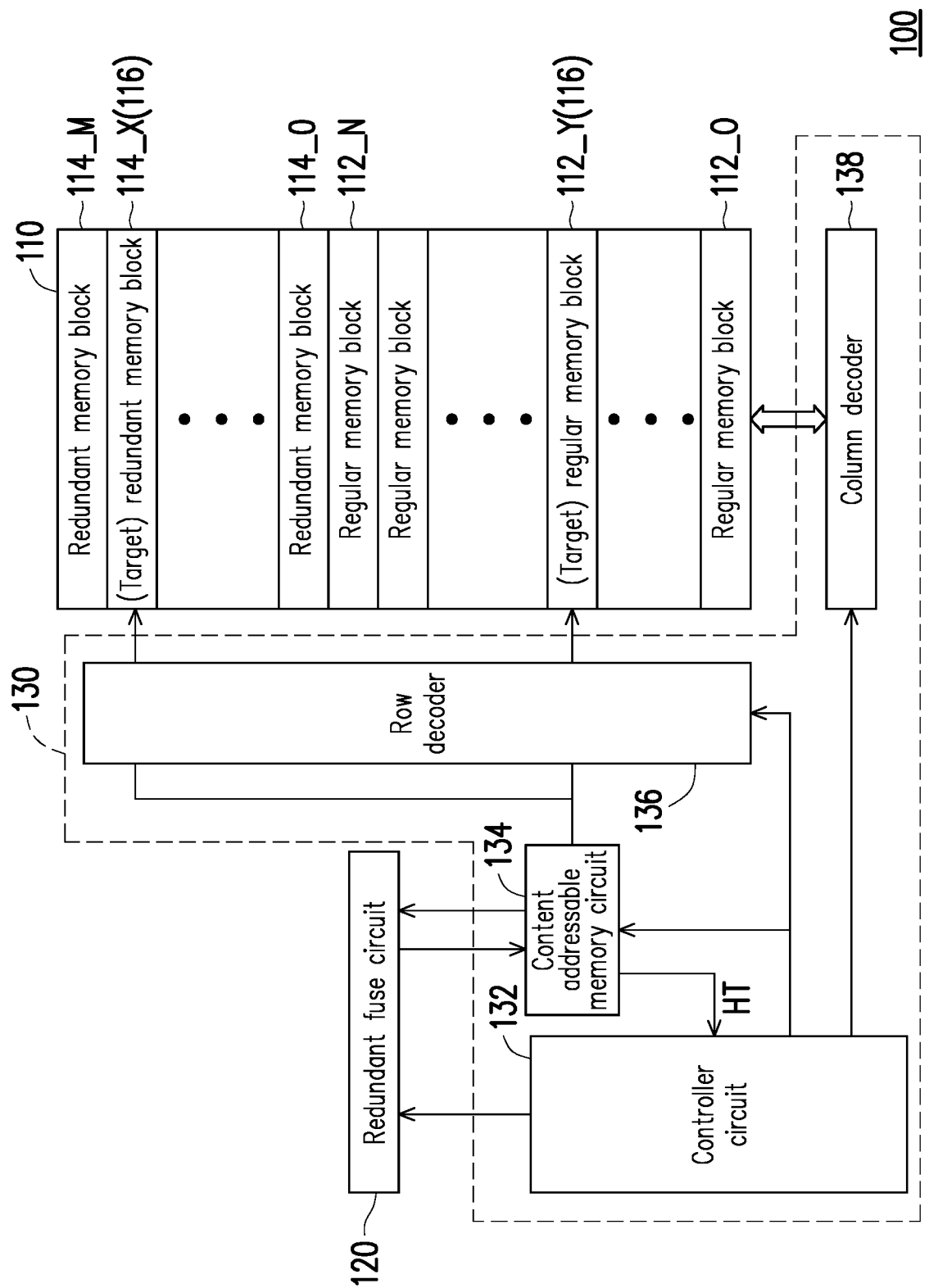
FIG. 2 is an internal block diagram of the memory device of the embodiment in FIG. 1.

Referring to FIGS. 1 and 2, a memory device 100 includes a memory cell array 110, a redundant fuse circuit 120, and a memory controller 130. The memory controller 130 is coupled with the memory cell array 110 and the redundant fuse circuit 120. The memory device 100 may be composed of, for example, a non-volatile memory device such as a flash memory, or a volatile memory device such as a dynamic random access memory (DRAM) and a static random access memory (SRAM), etc. Those skilled in the art may adopt an appropriate structure according to their actual needs.

The memory cell array 110 includes regular memory blocks 112_0 to 112_N and redundant memory blocks 114_0 to 114_M. The memory blocks 112_0 to 112_N are used to store data. N and M are both positive integers greater than 0, and N is usually greater than M. In one embodiment, N is, for example, equal to 255, and M is, for example, equal to 7, which means that the memory cell array 110 includes 256 regular memory blocks and 8 redundant memory blocks, but these numbers are not intended to limit the disclosure.

The redundant fuse circuit 120 is configured to record one or multiple repair information. Each of the repair information includes a repair address ADD_R of a regular memory block to be replaced with a redundant memory block. Specifically, the redundant fuse circuit 120 includes multiple groups of fuses. The fuses are, for example, non-volatile electronic fuses. When the memory cell array 110 is composed of non-volatile memory cells, the fuses may also be a part of the memory cell array 110. Each group of the fuses corresponds to one of the redundant memory blocks 114_0 to 114_M, and records one repair information. For example, users may perform an inspection procedure (such as a wafer probe test, a finished product test, a system booting self-test, etc.) on the memory cell array 110 in advance, so as to detect a bad regular memory block among the regular memory blocks 112_0 to 112_N. In addition, users may program (for example, by blowing a fuse with a high voltage) the redundant fuse circuit 120 through the memory controller 130 or an external tester, so as to record an address of the bad regular memory block as the repair address on one fuse group of the redundant fuse circuit 120. In this embodiment, the redundant memory blocks 114_0 to 114_M that are pre-erased are used to replace one or multiple regular memory blocks corresponding to one or multiple repair addresses recorded in the redundant fuse circuit 120.

In addition to the repair address, the repair information recorded in the redundant fuse circuit 120 may further include a first enable bit B1 and a second enable bit B2. For example, referring to FIG. 3, repair information 200 and repair information 210 are recorded on two fuse groups of the redundant fuse circuit 120, respectively. Each of the repair information 200 and the repair information 210 includes a repair address ADD_R, the first enable bit B1 and the second enable bit B2. In this embodiment, two fuse groups are shown for illustrative purposes, but the number is not intended to limit the disclosure.

The fuse group on which the repair information 210 is recorded corresponds to a redundant memory block 114_X. In other words, the redundant memory block 114_X may replace a regular memory block whose address is the repair address ADD_R in the repair information 210. The first enable bit B1 of the repair information 210 is configured to record a usage state of its corresponding fuse group. The second enable bit B2 is configured to enable the corresponding redundant memory block 114_X. For example, the first enable bit B1 and the second enable bit B2 may both be at a high logic level in an initial state. When the first enable bit B1 of the repair information 210 is programmed to a low logic level and the second enable bit B2 is programmed to a high logic level, it means that the fuse group has been used to replace the bad regular memory block with the redundant memory block 114_X. When the first enable bit B1 of the repair information 210 is at a high logic level, it means that the fuse group of the repair information 210 has not been used (and is in an available state). When the second enable bit B2 of the repair information 210 is programmed to a low logic level, it means that the corresponding redundant memory block 114_X is detected as bad and is disabled. In this embodiment, X is an integer greater than or equal to 0 and less than or equal to M. In addition, the operation of the first enable bit B1 and the first enable bit B2 will be described in more detail in the following embodiments.

The memory controller 130 is coupled with the memory cell array 110 and the redundant fuse circuit 120. As shown in FIG. 2, the memory controller 130 includes a control circuit 132, a content addressable memory (CAM) circuit 134, a row decoder 136, and a column decoder 138. In one embodiment, the memory controller 130 may include other suitable circuits for coordinating control of data access, such as a power on reset (POR) circuit, a state register, a high voltage generator, a page address latch/counter, a byte address latch/counter, etc. The disclosure is not limited thereto. In the embodiments of the disclosure, various circuits in the memory controller 130 may be implemented by any one of suitable circuit structures in the technical field. The disclosure is not limited thereto.

In this embodiment, the memory controller 130 is used, for example, to control an operation such as an erase operation, a soft program operation, and a diagnostic operation for a memory block on the entire memory device 100, so as to access the data stored in a memory block. For example, the control circuit 132 controls the row decoder 136 and the column decoder 138 according to an operation address ADD_O, so as to select a memory block for data access and perform an operations on the memory block.

In addition, the control circuit 132 is coupled with the CAM circuit 134. During a power on period, the control circuit 132 loads the repair information recorded by the redundant fuse circuit 120 (for example, the repair information 200 and the repair information 210) into the CAM circuit 134.

The CAM circuit 134 is configured to determine whether the operation address ADD_O is the same as any one of the repair addresses (for example, the repair address ADD_R of the repair information 200 or the repair address ADD_R of the repair information 210) in the redundant fuse circuit 120, determine whether the corresponding fuse group has been used according to the first enable bit B1 in the corresponding repair information, and determine whether the corresponding redundant memory block is enabled according to the second enable bit B2. The CAM circuit 134 generates a hit signal according to a determination result.

Figure 4:
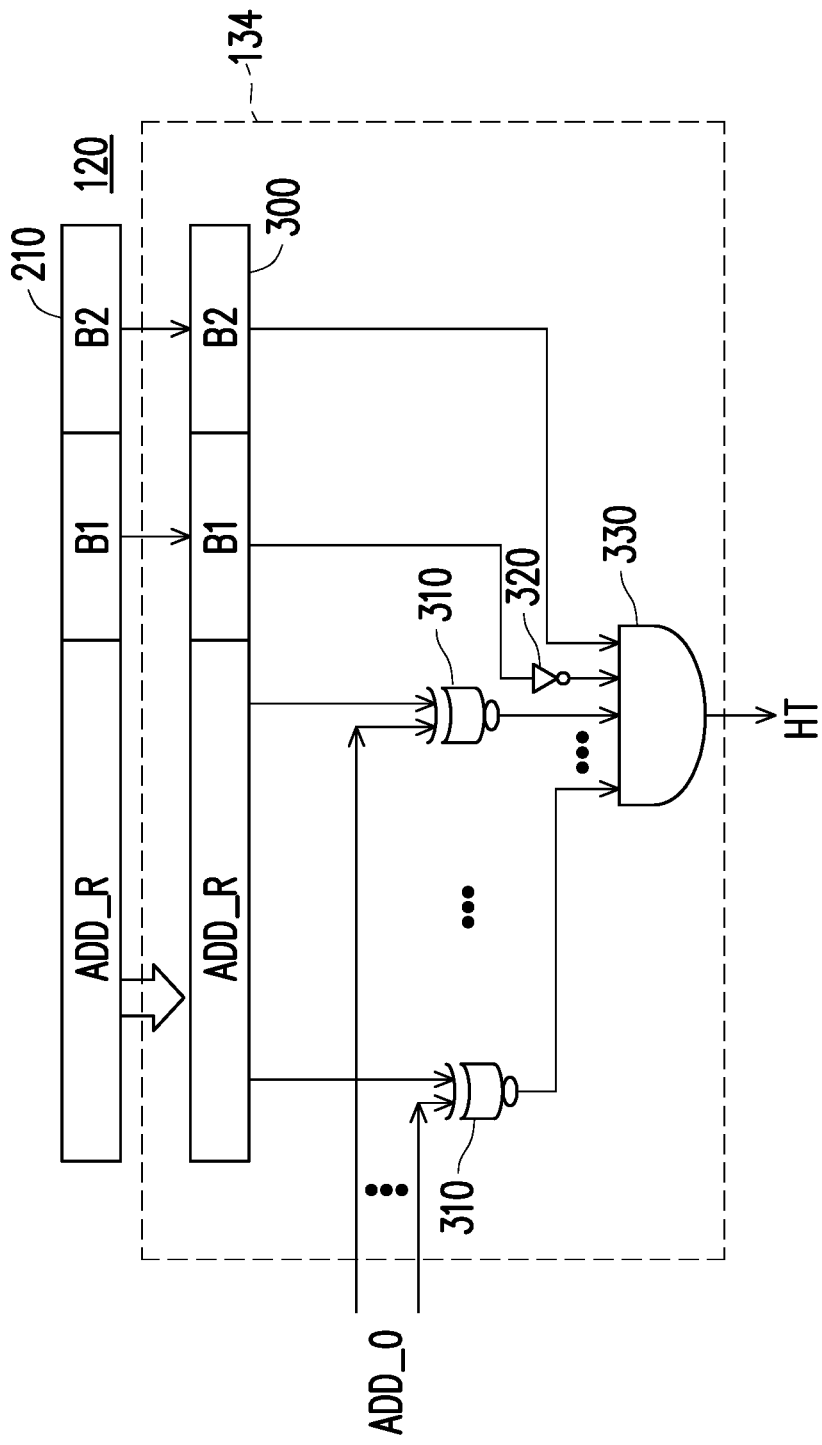
FIG. 4 is a schematic internal diagram of a CAM circuit according to an embodiment of the disclosure.

Referring to FIG. 4, the CAM circuit 134 includes multiple latches 300 and multiple determining circuits. For simplicity and clarity, FIG. 4 only exemplarily shows one of the latches 300 of the CAM circuit 134, and a fuse group and a determining circuit connected thereto. Each latch 300 is loaded with the repair information from one of the fuse groups of the redundant fuse circuit 120. Next, the control circuit 132 determines whether an available fuse group is present in the redundant fuse circuit 120. For example, the control circuit 132 determines whether any one of the first enable bits B1 latched by the latches 300 is at a high logic level. When any one of the first enable bits B1 is at a high logic level, the control circuit 132 determines that an available fuse group is present in the redundant fuse circuit 120. When the control circuit 132 determines that an available fuse group is present in the redundant fuse circuit 120, the CAM circuit 134 uses the determining circuits to determine whether the operation address ADD_O obtained from the control circuit 132 is the same as the repair address ADD_R in the repair information, whether the corresponding fuse group has been used according to the first enable bit B1 in the corresponding repair information, and whether the corresponding redundant memory block is enabled according to the second enable bit B2. When the determining circuit determines that the operation address ADD_O obtained from the control circuit 132 is the same as the repair address ADD_R, the corresponding fuse group has been used (for example, the first enable bit B1 is at a low logic level), and the corresponding redundant memory block is enabled (for example, the second enable bit B2 is at a high logic level), the determining circuit generates a hit signal HT with a high logic level. The hit signal HT with a high logic level is configured to change a logic state of the second enable bit B2 in the corresponding repair information. For example, the hit signal HT with a high logic level causes the second enable bit B2 to be programmed to a low logic level, thereby disabling the corresponding redundant memory block and enabling another redundant memory block. The details are described later. In this embodiment, the determining circuit includes multiple XNOR gates 310, an inverter 320, and an AND gate 330. Each of the latches 300 provides multiple bits of the repair address ADD_R in the repair information to input terminals of the XNOR gates 310, and compares the multiple bits of the repair address ADD_R with multiple bits of the operation address ADD_O. In addition, each of the latches 300 provides the first enable bit B1 in the repair information to an input terminal of the inverter 320, and provides the second enable bit B2 in the repair information to an input terminal of the AND gate 330. The AND gate 330 receives the output of the XNOR gates 310 and the inverter 320 and the second enable bit B2, performs a logical AND operation accordingly to generate an operation result, and uses the operation result as the hit signal HT.

In this way, the CAM circuit 134 is loaded with the repair information from the redundant fuse circuit 120 and performs a comparison so as to generate the corresponding hit signal HT. Those skilled in the art may derive modifications from the teachings of the embodiments of the disclosure according to their actual needs. In one embodiment, an OR gate may be used in the CAM circuit 134 to receive all hit signals and generate a total hit signal configured to disable a regular memory block.

Figure 3:
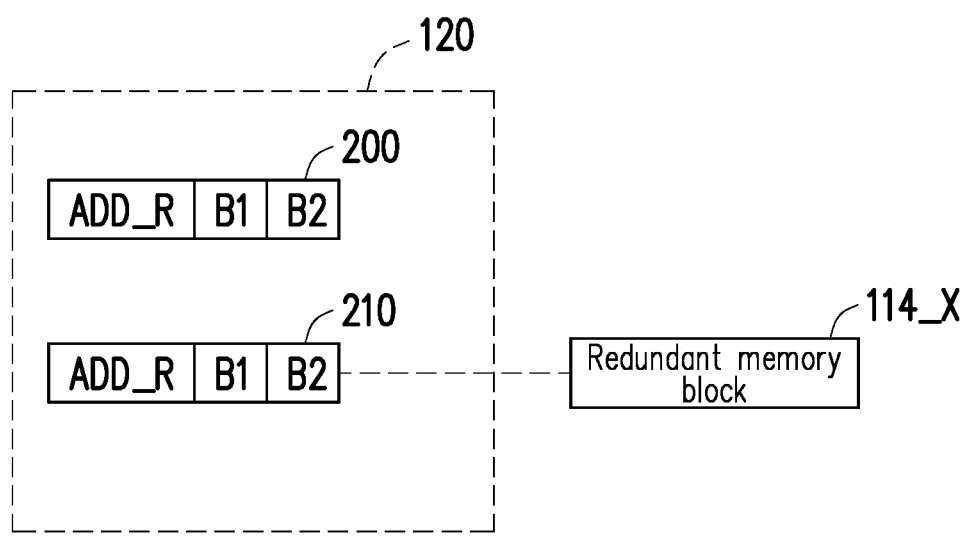
FIG. 3 is an example of a configuration of repair information according to an embodiment of the disclosure.
Figure 5:
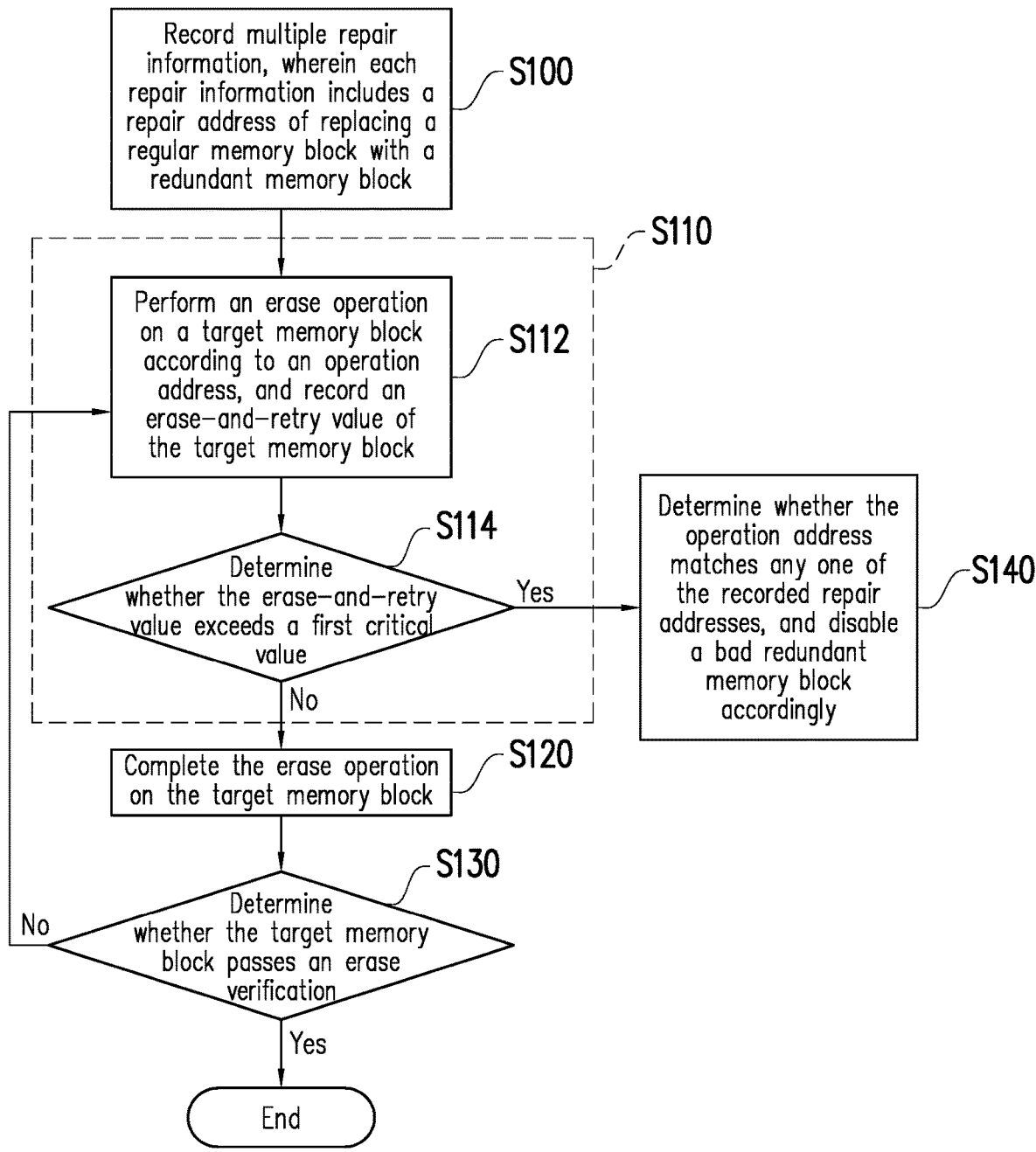
FIG. 5 is a flowchart of steps of an operating method of a memory device according to an embodiment of the disclosure.

FIG. 5 is a flowchart of steps of an operating method of a memory device according to an embodiment of the disclosure. The operating method of this embodiment is adapted for a flash memory, for example. Referring to FIGS. 2, 3, and 5 together, each step of the operating method of the disclosure is described with reference to the components of the memory device 100.

In step S100, the redundant fuse circuit 120 records one or multiple repair information (for example, the repair information 200 and the repair information 210). Each of the repair information includes the repair address ADD_R of a regular memory block to be replaced with a redundant memory block coupled therewith. For example, the repair information 210 includes the repair address ADD_R of the regular memory block to be replaced with the redundant memory block 114_X.

In step S110, the memory controller 130 (the control circuit 132) performs an operation on a target memory block 116 according to the operation address ADD_O, and determines whether the target memory block 116 is bad. In this embodiment, the target memory block 116 is the redundant memory block 114_X or a regular memory block 112_Y. When the repair address ADD_R which is same as the operation address ADD_O is recorded in the current redundant fuse circuit 120, it means that a bad regular memory block is replaced by the redundant memory block 114_X. At this time, the target memory block 116 is the redundant memory block 114_X among the redundant memory blocks 114_0 to 114_M. When the repair address ADD_R which is the same as the operation address ADD_O is not recorded in the current redundant fuse circuit 120, the target memory block 116 is the regular memory block 112_Y among the regular memory blocks 112_0 to 112_N. In this embodiment, Y is an integer greater than or equal to 0 and less than or equal to N.

Step S110 includes step S112 and step S114. In step S112, after receiving an instruction to erase a block of the operation address ADD_O, the memory controller 130 (the control circuit 132) performs an erase operation on the target memory block 116 according to the operation address ADD_O, and records an erase-and-retry value α of the target memory block 116.

In step S114, the memory controller 130 (the control circuit 132) determines whether the erase-and-retry value α exceeds a first critical value T1. If the memory controller 130 determines that the erase-and-retry value α does not exceed the first critical value T1, the memory controller 130 determines that the target memory block 116 is not bad, and the operation proceeds to step S120.

In step S120, the memory controller 130 completes the erase operation on the target memory block 116. Specifically, the control circuit 132 applies an erase pulse to the target memory block 116 to erase the data stored therein.

In step S130, the memory controller 130 (the control circuit 132) determines whether the target memory block 116 passes an erase verification. In this embodiment, if the target memory block 116 passes the erase verification, the control circuit 132 ends the erase operation. If the target memory block 116 fails to pass the erase verification, the control circuit 132 executes step S110 to determine again whether the erase-and-retry value α of the target memory block 116 exceeds the first critical value T1.

Referring back to step S114, if the memory controller 130 determines that the erase-and-retry value α exceeds the first critical value T1, the memory controller 130 determines that the target memory block 116 is bad, and the operation proceeds to step S140. In step S140, the memory controller 130 determines whether the operation address ADD_O matches any one of the repair addresses ADD_R in the redundant fuse circuit 120, and disables the bad redundant memory block accordingly.

Figure 6:
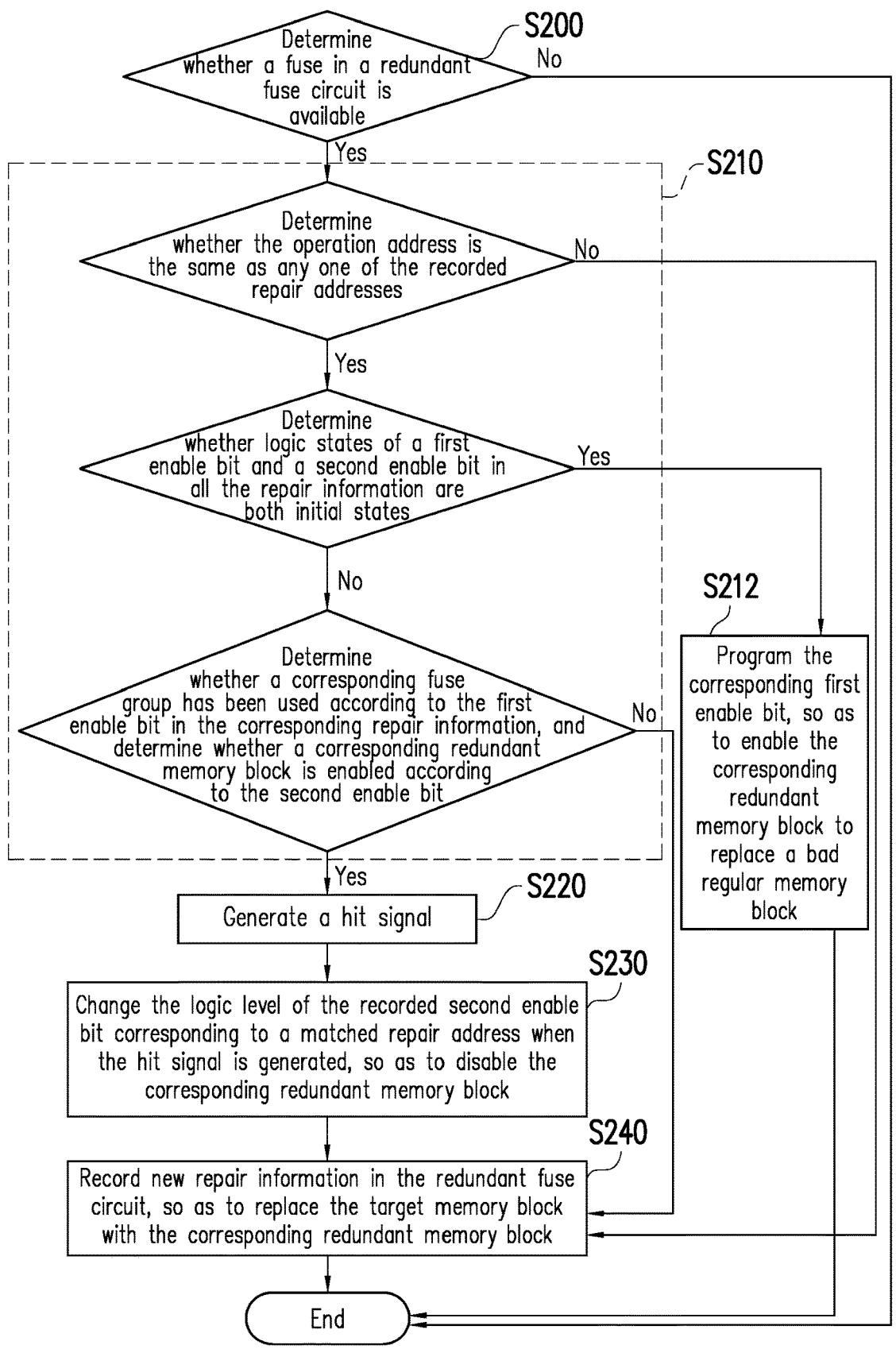
FIG. 6 is a flowchart of steps of an operating method of a memory device according to an embodiment of the disclosure.

An example is given in FIG. 6 to illustrate the operation of step S140 in detail. Referring to FIGS. 2, 3, and 6 together, each step of the operating method of the disclosure is described with reference to the components of the memory device 100.

In step S200, the memory controller 130 (the control circuit 132) determines whether an available fuse is present in the redundant fuse circuit 120. Specifically, the control circuit 132, for example, checks whether any of the first enable bits B1 in the CAM circuit 134 indicates a high logic level, so as to determine whether an available fuse group is present.

If the memory controller 130 determines that no available fuse is present in the redundant fuse circuit 120, the memory controller 130 ends the operation.

If the memory controller 130 determines that an available fuse is present in the redundant fuse circuit 120, in step S210, the CAM circuit 134 determines whether the operation address ADD_O is the same as any one of the repair addresses ADD_R in the redundant fuse circuit 120, whether the corresponding fuse group has been used according to the first enable bit B1 in the corresponding repair information, and whether the corresponding redundant memory block is enabled according to the second enable bit B2. The details thereof have been described in the above embodiment of FIG. 4, and are omitted herein.

If the CAM circuit 134 determines that the operation address ADD_O is the same as the repair address ADD_R of the repair information 210, determines that the corresponding fuse group has been used, and determines that when the corresponding redundant memory block is enabled, the CAM circuit 134 generates a hit signal (step S220), which means that the target memory block 116 that is currently operated according to the operation address ADD_O and is determined to be bad is the redundant memory block 114_X.

Next, in step S230, when the hit signal is generated, the control circuit 132 changes the logic level of the recorded second enable bit B2 corresponding to the matched repair address ADD_R, so as to disable the corresponding redundant memory block 114_X. Specifically, the control circuit 132 receives the hit signal from the CAM circuit 134, and determines the corresponding fuse group according to an address of a signal line from which the hit signal is issued. The control circuit 132 programs the second enable bit B2 in the corresponding fuse group to a low logic level, so as to disable the redundant memory block 114_X corresponding to the corresponding repair information 210.

In step S240, the memory controller 132 records new repair information in the available fuse group of the redundant fuse circuit 120, so as to replace the target memory block 116 with the redundant memory block corresponding to the available fuse group recorded with the new repair information. Specifically, the memory controller 132 selects one of the available fuse groups of the redundant fuse circuit 120, records (programs) the matched repair address ADD_R in the selected available fuse group, and programs the first enable bit B1 of the selected available fuse group to a low logic level. In this way, the memory controller 132 replaces the target memory block 116 which is the disabled redundant memory block 114_X with another pre-erased redundant memory block.

Referring back to step S210, if the CAM circuit 134 determines that the operation address ADD_O is not the same as the repair address ADD_R of the repair information 210 or that the logic states of the first enable bit B1 and the second enable bit B2 in the corresponding repair information are the same, the CAM circuit 134 does not generate the hit signal HT with a high logic level, and the operation directly proceeds to step S240. Specifically, in step S210, if the CAM circuit 134 determines that the operation address ADD_O is not the same as the repair address ADD_R of all of the repair information 210, it means that the target memory block 116 that is currently operated according to the operation address ADD_O is the regular memory block 112_Y that is bad, but no repair information 210 equal to the operation address ADD_O has been recorded in the redundant fuse circuit 120. Therefore, the operation proceeds to step S240. In step S210, if the CAM circuit 134 determines that the operation address ADD_O is the same as the repair address ADD_R of any one of the repair information 210, but that the logic states of the first enable bit B1 and the second enable bit B2 in all of the repair information are both initial states, it means that the target memory block 116 that is currently operated according to the operation address ADD_O is the regular memory block 112_Y that is bad, but no redundant memory block has been enabled to replace the bad regular memory block 112_Y. Therefore, the memory controller 132 programs the first enable bit B1 corresponding to the matched repair address ADD_R to a low logic level, so as to enable the corresponding redundant memory block to replace the bad regular memory block 112_Y (step S212).

In step S240, the memory controller 132 creates new repair information and records the new repair information in the redundant fuse circuit 120. In this way, the memory controller 132 replaces the target memory block 116 which is the bad regular memory block 112_Y with another pre-erased redundant memory block.

Through the aforementioned operating method of the memory device, the memory controller 130 disables the redundant memory block 114_X that is determined to be bad. In addition, within a time interval specified in the erase operation, the memory controller 130 replaces the disabled redundant memory block 114_X with another pre-erased redundant memory block. In this way, reliability and the operating speed of the memory block can be improved.

Figure 7:
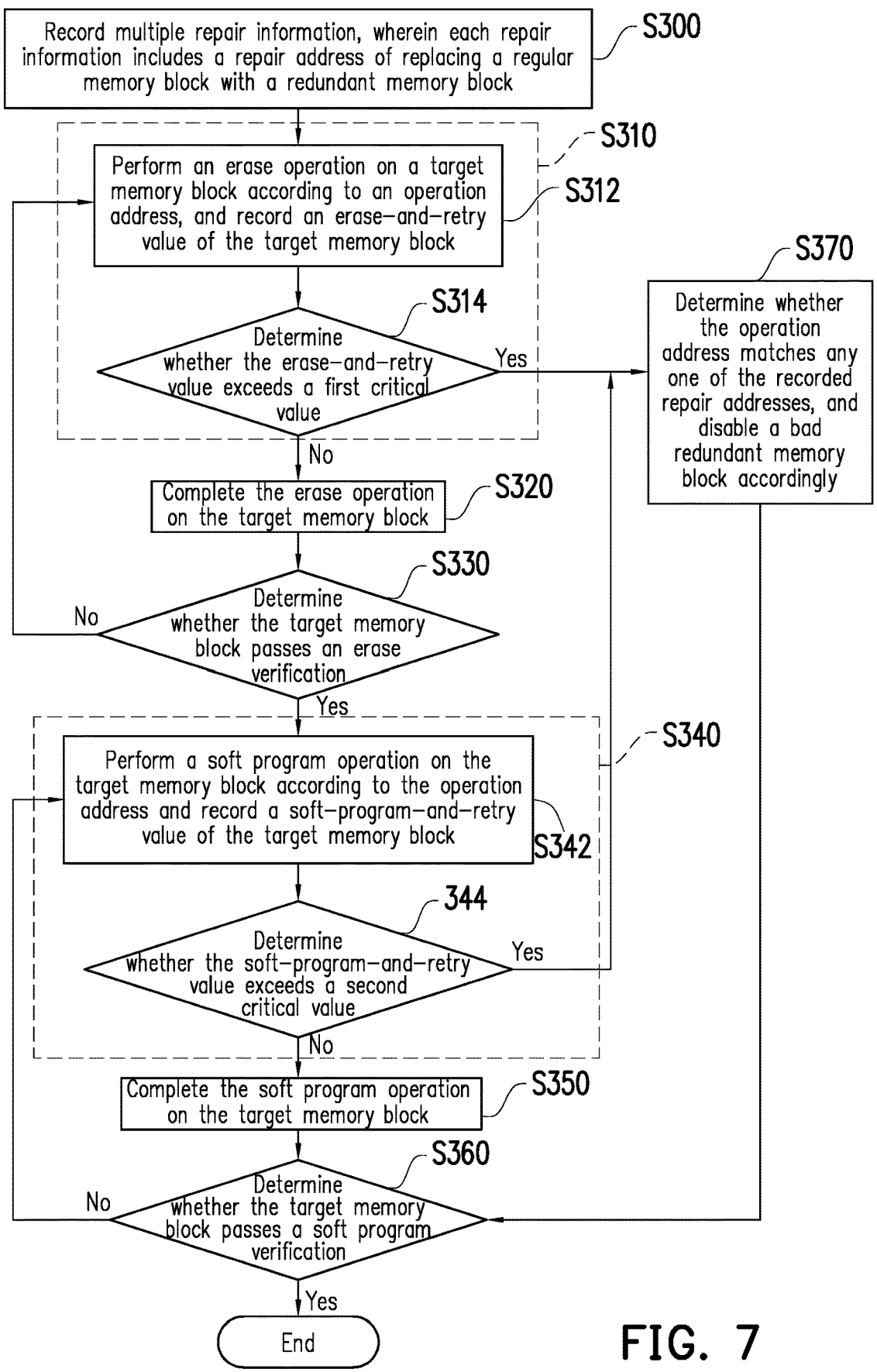
FIG. 7 is a flowchart of steps of an operating method of a memory device according to another embodiment of the disclosure.

FIG. 7 is a flowchart of steps of an operating method of a memory device according to another embodiment of the disclosure. The operating method of this embodiment is adapted for, for example, a flash memory device. Referring to FIGS. 2, 3, and 7 together, the operating method of a flash memory device of this embodiment is similar to the operating method of the embodiment of FIG. 5. The main difference between the two operating methods is that, for example, in the operating method of the embodiment of FIG. 7, whether the target memory block 116 is bad is further determined according to whether a soft-program-and-retry value β exceeds a second critical value T2. Therefore, in this embodiment, two parameters for determining whether the target memory block 116 is bad include the erase-and-retry value α and the soft-program-and-retry value β.

Specifically, in step S330, if the target memory block 116 passes the erase verification, the operation proceeds to step S340.

In step S340, the memory controller 130 (the control circuit 132) performs an operation on the target memory block 116 according to the operation address ADD_O, and determines whether the target memory block 116 is bad.

Step S340 includes step S342 and step S344. In step S342, after receiving an instruction to soft program the block of the operation address ADD_O, the control circuit 132 performs a soft program operation on the target memory block 116 according to the operation address ADD_O, and records the soft-program-and-retry value β of the target memory block 116.

In step S344, the memory controller 130 (the control circuit 132) determines whether the soft-program-and-retry value β exceeds the second critical value T2. If the memory controller 130 determines that the soft-program-and-retry value β does not exceed the second critical value T2, the memory controller 130 determines that the target memory block 116 is not bad, and the operation proceeds to step S350.

In step S350, the memory controller 130 (the control circuit 132) completes the soft program operation on the target memory block 116. The soft program operation is, for example, applying a soft program voltage that is lower than a voltage applied during a normal program to a word line in a block, so as to provide power to inject an electric charge into a memory cell so that an initial voltage changes in the forward direction. The soft program voltage is lower than a normal program voltage, and thus makes it relatively easy to inject an electric charge into an erased memory cell, while making it relatively difficult to inject an electric charge into a memory cell with an initial voltage near an upper limit. Sufficient teachings, suggestions, and description of implementation about the soft program operation of this embodiment may be obtained from common knowledge in the technical field.

In step S360, the memory controller 130 (the control circuit 132) determines whether the target memory block 116 passes a soft program verification. In this embodiment, if the target memory block 116 passes the soft program verification, the control circuit 132 ends the soft program operation. If the target memory block 116 fails to pass the soft program verification, the control circuit 132 executes step S340 to determine again whether the soft-program-and-retry value β of the target memory block 116 exceeds the second critical value T2.

Referring back to step S344, if the memory controller 130 determines that the soft-program-and-retry value β exceeds the second critical value T2, the memory controller 130 determines that the target memory block 116 is bad, and the operation proceeds to step S370. In step S370, the memory controller 130 determines whether the operation address ADD_O matches any one of the repair addresses ADD_R in the redundant fuse circuit 120, and disables the bad redundant memory block accordingly.

In addition, step S300, step S310, step S312, step S314, step S320, step S330, and step S370 of the embodiment of the disclosure are respectively the same as or similar to step S100, step S110, step S112, step S114, step S120, step S130 and step S140 of the aforementioned embodiment, and the details are omitted herein.

Through the aforementioned operating method of the memory device, the memory controller 130 disables the redundant memory block 114_X that is determined to be bad. In addition, within a time interval specified in the erase operation or the soft program operation, the memory controller 130 replaces the disabled redundant memory block 114_X with another pre-erased redundant memory block. In this way, reliability and the operating speed of the memory block can be improved.

Figure 8:
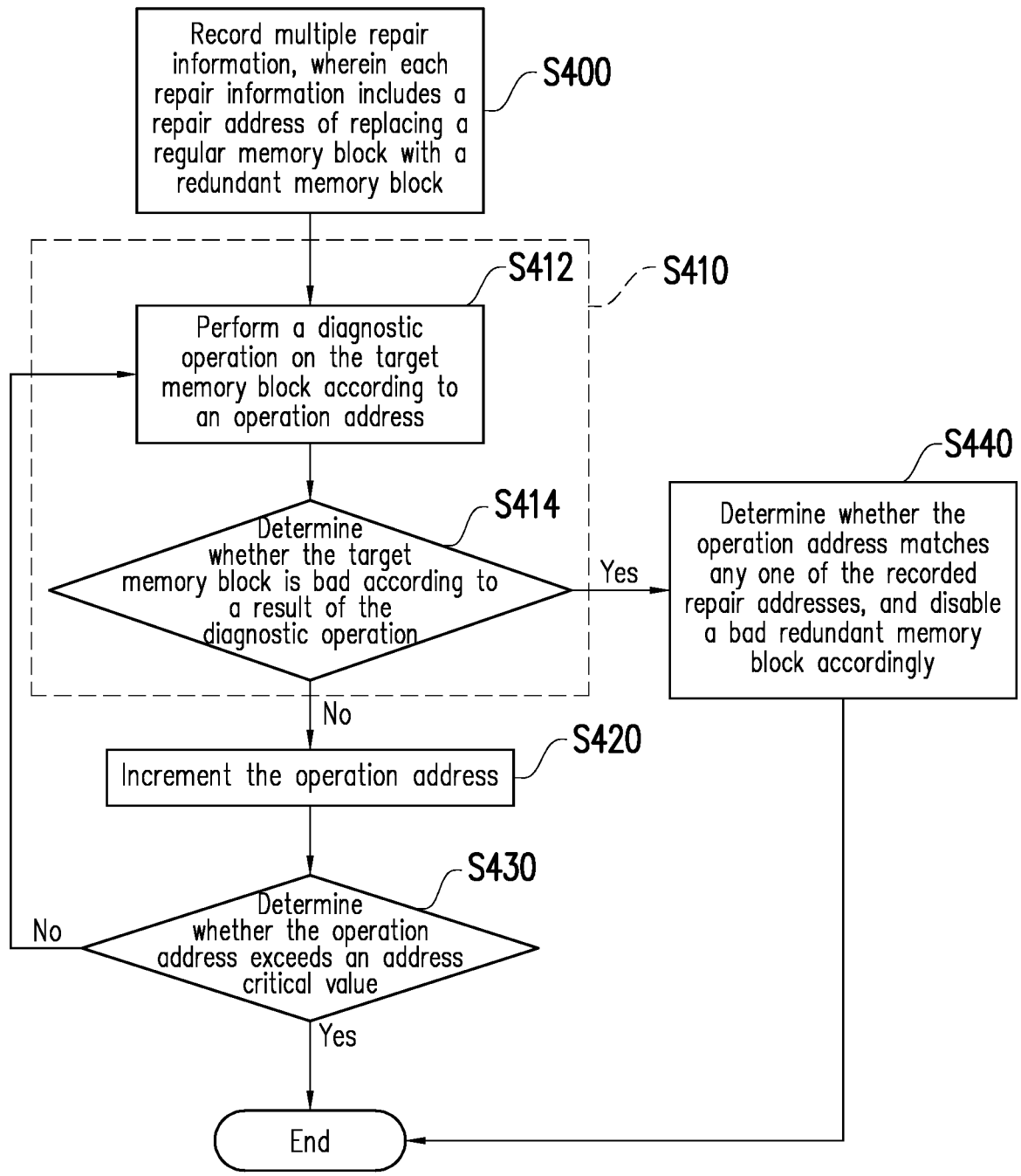
FIG. 8 is a flowchart of steps of an operating method of a memory device according to yet another embodiment of the disclosure.

FIG. 8 is a flowchart of steps of an operating method of a memory device according to yet another embodiment of the disclosure. Different from the aforementioned embodiments, the operating method of this embodiment is, for example, adapted for a volatile memory device such as a dynamic random access memory, and a static random access memory, etc. Referring to FIGS. 2, 3, and 8 together, each step of the operating method of the disclosure is described with reference to the components of the memory device 100.

In step S400, the redundant fuse circuit 120 records one or multiple repair information (for example, the repair information 200 and the repair information 210). Each of the repair information 200 and the repair information 210 includes the repair address ADD_R.

In step S410, the memory controller 130 performs an operation on the target memory block 116 according to the operation address ADD_O, and determines whether the target memory block 116 is bad.

Step S410 includes step S412 and step S414. In step S412, after receiving an instruction to diagnose the block of operation address ADD_O, the memory controller 130 (the control circuit 132) performs a diagnostic operation on the target memory block 116 according to the operation address ADD_O. In this embodiment, the diagnostic operation is, for example, determining whether the target memory block 116 is bad, and sufficient teachings, suggestions, and description of implementation about the diagnostic operation may be obtained from common knowledge in the technical field.

In step S414, the memory controller 130 determines whether the target memory block 116 is bad according to a result of the diagnostic operation. If the memory controller 130 determines that the target memory block 116 is bad, the operation proceeds to step S440. Step S440 is the same as or similar to step S140 of the aforementioned embodiment, and the details thereof are omitted herein.

If the memory controller 130 determines that the target memory block 116 is not bad, the operation proceeds to step S420. In step S420, the memory controller 130 (the control circuit 132) increments the operation address ADD_O.

Next, in step S430, the memory controller 130 (the control circuit 132) determines whether the incremented operation address ADD_O exceeds an address critical value γ. In this embodiment, if the control circuit 132 determines that the incremented operation address ADD_O exceeds the address critical value γ, the control circuit 132 ends the diagnostic operation. If the control circuit 132 determines that the incremented operation address ADD_O does not exceed the address critical value γ, the control circuit 132 executes step S410, and determines again whether the target memory block 116 that is operated according to the incremented operation address ADD_O is bad.

In summary, the memory controller of the disclosure, after determining that a target memory block is bad, further determines whether a current operation address matches any one of the repair addresses recorded in a redundant fuse circuit. Therefore, the memory controller of the disclosure not only identifies a bad regular memory block but also identifies and disables a bad redundant memory block, thereby improving the operating speed and reliability of a memory block.

What is claimed is:

1. A memory device, comprising:
a memory cell array comprising a plurality of regular memory blocks and a plurality of redundant memory blocks, wherein the plurality of regular memory blocks are configured to store data;
a redundant fuse circuit comprising a plurality of fuse groups configured to record a plurality of repair information, wherein each of the plurality of repair information is associated with a corresponding one of the plurality of redundant memory blocks, and each of the plurality of repair information comprises:
a repair address configured to indicate a position of the regular memory block that is to be replaced by the associated redundant memory block;
a first enable bit configured to record a usage state of a corresponding one of the plurality of fuse groups, wherein a first logic state of the first enable bit indicates that the corresponding one of the plurality of fuse groups has been used, and a second logic state of the first enable bit indicates that the corresponding one of the plurality of fuse groups has not been used and is an available fuse group; and
a second enable bit configured to enable a corresponding one of the plurality of redundant memory blocks, wherein a first logic state of the second enable bit indicates that the corresponding one of the plurality of redundant memory blocks is bad, and a second logic state of the second enable bit indicates that the corresponding one of the plurality of redundant memory blocks is not bad; and
a memory controller coupled with the memory cell array and the redundant fuse circuit and configured to perform an operation on a target memory block according to an operation address and to determine whether the target memory block is bad, wherein the memory controller comprises a plurality of determining circuits, and each of the plurality of determining circuits generates a hit signal according to the operation address, the repair address, the first enable bit, and the second enable bit, wherein when the target memory block is bad, and the determining circuit of the memory controller generates the hit signal, the memory controller disables the redundant memory block that is bad according to the hit signal.

2. The memory device according to claim 1, wherein when the target memory block is bad, the memory controller determines whether an available fuse group is present in the plurality of fuse groups according to the first enable bit, and when the available fuse group is present in the redundant fuse circuit, the memory controller records new repair information in the redundant fuse circuit after the hit signal is generated, so as to replace the target memory block with the redundant memory block associated with the new repair information.

3. The memory device according to claim 2, wherein the memory controller comprises:
a content addressable memory (CAM) circuit, comprising the plurality of determining circuits and a plurality of latches coupled with the plurality of determining circuits respectively, wherein the plurality of latches are configured to load in the plurality of repair information from the redundant fuse circuit, and each of the plurality of determining circuits is configured to generate the hit signal when each of the plurality of determining circuits deter nines that the operation address is the same as any one of the repair address in the redundant fuse circuit, a corresponding one of the plurality of fuse groups has been used, and a corresponding one of the plurality of redundant memory blocks is enabled; and
a control circuit coupled with the CAM circuit and configured to provide the operation address to the CAM circuit and change a logic level of the second enable bit in the repair information corresponding to the repair address that is the same as the operation address recorded by the redundant fuse circuit according to the hit signal, so as to disable the corresponding redundant memory block.

4. The memory device according to claim 3, wherein during a power on period, the control circuit loads the plurality of repair information from the redundant fuse circuit into the plurality of latches of the CAM circuit.

5. The memory device according to claim 1, wherein each of the plurality of determining circuits comprises:
a plurality of XNOR gates configured to compare the operation address with the repair address;
an inverter configured to receive the first enable bit and output a reverse value of the first enable bit; and
an AND gate configured to receive an output of the plurality of XNOR gates, the reverse value of the first enable bit, and the second enable bit, and generate the hit signal.

6. The memory device according to claim 1, wherein the memory controller performs a diagnostic operation on the target memory block according to the operation address, and determines whether the target memory block is bad according to a result of the diagnostic operation, wherein if the target memory block is not bad, the memory controller increments the operation address, so as to perform the diagnostic operation on a next memory block.

7. The memory device according to claim 1, wherein the memory controller performs an erase operation on the target memory block according to the operation address and records an erase-and-retry value of the target memory block, and the memory controller determines whether the erase-and-retry value exceeds a first critical value, wherein if the erase-and-retry value exceeds the first critical value, the memory controller determines that the target memory block is bad.

8. The memory device according to claim 7, wherein if the erase-and-retry value does not exceed the first critical value, the memory controller completes the erase operation on the target memory block, and determines whether the target memory block passes an erase verification.

9. The memory device according to claim 7, wherein the memory controller further performs a soft program operation on the target memory block according to the operation address and records a soft-program-and-retry value of the target memory block, and the memory controller determines whether the soft-program-and-retry value exceeds a second critical value, wherein if the soft-program-and-retry value exceeds the second critical value, the memory controller determines that the target memory block is bad.

10. The memory device according to claim 9, wherein if the erase-and-retry value does not exceed the second critical value, the memory controller completes the soft program operation on the target memory block, and determines whether the target memory block passes a soft program verification.

11. An operating method of a memory device, wherein the memory device comprises a plurality of regular memory blocks and a plurality of redundant memory blocks, and the plurality of regular memory blocks are configured to store data, wherein the operating method comprises:
recording a plurality of repair information, wherein each of the plurality of repair information is associated with one of the plurality of redundant memory blocks, and each of the plurality of repair information comprises:
a repair address configured to indicate a position of the regular memory block that is to be replaced by the associated redundant memory block;
a first enable bit configured to record a usage state of a fuse in the redundant fuse circuit, wherein a first logic state of the first enable bit indicates that the corresponding one of the plurality of fuse groups has been used, and a second logic state of the first enable bit indicates that the corresponding one of the plurality of fuse groups has not been used and is an available fuse group; and
a second enable bit configured to enable the redundant memory block, wherein a first logic state of the second enable bit indicates that the corresponding one of the plurality of redundant memory blocks is bad, and a second logic state of the second enable bit indicates that the corresponding one of the plurality of redundant memory blocks is not bad;
performing an operation on a target memory block according to an operation address and determining whether the target memory block is bad;
generating a hit signal according to the operation address, the repair address, the first enable bit, and the second enable bit when the target memory block is bad; and
disabling the redundant memory block that is bad according to the hit signal.

12. The operating method of a memory device according to claim 11, further comprising:
determining whether an available fuse group is present in the plurality of fuse groups according to the first enable bit before generating the hit signal.

13. The operating method of a memory device according to claim 12, further comprising:
recording new repair information in the redundant fuse circuit after disabling the redundant memory block that is bad when the available fuse group is present in the redundant fuse circuit, so as to replace the target memory block with the redundant memory block associated with the new repair information.

14. The operating method of a memory device according to claim 11, wherein generating the hit signal comprises:
determining whether the operation address is the same as any one of the repair address that is recorded, determining whether a corresponding one of the plurality of fuse groups has been used according to the first enable bit in the repair information corresponding to the repair address that is the same as the operation address, and determining whether a corresponding one of the plurality of redundant memory blocks is enabled according to the second enable bit; and
generating the hit signal when the operation address is the same as the repair address that is recorded, the corresponding one of the plurality of fuse groups has been used, and the corresponding one of the plurality of redundant memory blocks is enabled,
wherein disabling the redundant memory block that is bad according to the hit signal comprises: changing a logic level of the second enable bit in the repair information corresponding to the repair address that is recorded and that is the same as the operation address when the hit signal is generated, so as to disable the corresponding redundant memory block.

15. The operating method of a memory device according to claim 11, wherein generating the hit signal comprises:
comparing the operation address with the repair address through a plurality of XNOR gates;
receiving the first enable bit through an inverter, and outputting a reverse value of the first enable bit; and
receiving an output of the plurality of XNOR gates, the reverse value of the first enable bit, and the second enable bit through an AND gate, and generating the hit signal.

16. The operating method of a memory device according to claim 11, wherein performing the operation on the target memory block according to the operation address and determining whether the target memory block is bad comprise:
performing a diagnostic operation on the target memory block according to the operation address; and
determining whether the target memory block is bad according to a result of the diagnostic operation,
wherein the operating method further comprises:
incrementing the operation address so as to perform the diagnostic operation on a next memory block if the target memory block is not bad.

17. The operating method of a memory device according to claim 11, wherein preforming the operation on the target memory block according to the operation address and determining whether the target memory block is bad comprise:
performing an erase operation on the target memory block according to the operation address, and recording an erase-and-retry value of the target memory block;
determining whether the erase-and-retry value exceeds a first critical value; and
determining that the target memory block is bad if the erase-and-retry value exceeds the first critical value.

18. The operating method of a memory device according to claim 17, further comprising:
completing the erase operation on the target memory block if the erase-and-retry value does not exceed the first critical value; and
determining whether the target memory block passes an erase verification.

19. The operating method of a memory device according to claim 17, wherein performing the operation on the target memory block according to the operation address and determining whether the target memory block is bad further comprise:
performing a soft program operation on the target memory block according to the operation address, and recording a soft-program-and-retry value of the target memory block;
determining whether the soft-program-and-retry value exceeds a second critical value; and
determining that the target memory block is bad if the soft-program-and-retry value exceeds the second critical value.

20. The operating method of a memory device according to claim 19, further comprising:
completing the soft program operation on the target memory block if the erase-and-retry value does not exceed the second critical value; and
determining whether the target memory block passes a soft program verification.

* * * * *